United States Patent
Kashihara et al.

(10) Patent No.: US 9,293,647 B2
(45) Date of Patent: Mar. 22, 2016

(54) NITRIDE SEMICONDUCTOR LIGHT-EMITTING DEVICE AND METHOD OF MANUFACTURING THE SAME

(71) Applicants: Sharp Kabushiki Kaisha, Osaka-shi, Osaka (JP); Yamaguchi University, Yamaguchi-shi, Yamaguchi (JP)

(72) Inventors: Hiroyuki Kashihara, Ube (JP); Narihito Okada, Ube (JP); Kazuyuki Tadatomo, Ube (JP); Haruhisa Takiguchi, Osaka (JP)

(73) Assignees: SHARP KABUSHIKI KAISHA, Osaka-Shi (JP); YAMAGUCHI UNIVERSITY, Yamaguchi-Shi (JP)

( * ) Notice: Subject to any disclaimer, the term of this patent is extended or adjusted under 35 U.S.C. 154(b) by 0 days.

(21) Appl. No.: 14/363,254

(22) PCT Filed: Dec. 5, 2012

(86) PCT No.: PCT/JP2012/081486
§ 371 (c)(1),
(2) Date: Jun. 5, 2014

(87) PCT Pub. No.: WO2013/084926
PCT Pub. Date: Jun. 13, 2013

(65) Prior Publication Data
US 2014/0332756 A1      Nov. 13, 2014

(30) Foreign Application Priority Data

Dec. 6, 2011 (JP) ................. 2011-266822

(51) Int. Cl.
*H01L 33/06* (2010.01)
*H01L 33/32* (2010.01)
(Continued)

(52) U.S. Cl.
CPC ............ *H01L 33/06* (2013.01); *H01L 33/0025* (2013.01); *H01L 33/0075* (2013.01); *H01L 33/24* (2013.01); *H01L 33/32* (2013.01); *H01L 33/08* (2013.01)

(58) Field of Classification Search
CPC ......... H01L 33/06; H01L 33/32; H01L 33/24; H01L 33/0025; H01L 33/0075; H01L 33/08
USPC ............ 257/12–15, 79–82, E33.001–E33.04, 257/E33.049, E31.105; 438/46, 77, 93, 438/285, 483, 590, 604, 718
See application file for complete search history.

(56) References Cited

U.S. PATENT DOCUMENTS

| 7,355,210 B2 | 4/2008 | Ou et al. |
| 7,385,226 B2 | 6/2008 | Ou et al. |
| 8,148,252 B1 * | 4/2012 | Figuet et al. .................. 438/604 |

FOREIGN PATENT DOCUMENTS

JP        2005277423        10/2005

OTHER PUBLICATIONS

W.V. Lundin, etc. "Single quantumwelldeep-greenLEDswithburiedInGaN/GaN short-periodsuperlattice", available online Sep. 22, 2010, Journal of Crystal Growth 315 (2011) 267-271.*

(Continued)

*Primary Examiner* — Yasser A Abdelaziez
*Assistant Examiner* — Farun Lu
(74) *Attorney, Agent, or Firm* — Morrison & Foerster LLP

(57) ABSTRACT

A nitride semiconductor light-emitting device is formed of an n-type nitride semiconductor layer, a trigger layer, a V-pit expanding layer, a light-emitting layer, and a p-type nitride semiconductor layer provided in this order. The light-emitting layer has a V-pit formed therein. The trigger layer is made of a nitride semiconductor material having a lattice constant different from that of a material that forms an upper surface of the n-type nitride semiconductor layer. The V-pit expanding layer is made of a nitride semiconductor material having a lattice constant substantially identical to that of the material that forms the upper surface of the n-type nitride semiconductor layer, and the V-pit expanding layer has a thickness of 5 nm or more and 5000 nm or less.

14 Claims, 5 Drawing Sheets

(51) Int. Cl.
H01L 33/24 (2010.01)
H01L 33/00 (2010.01)
H01L 33/08 (2010.01)

(56) References Cited

OTHER PUBLICATIONS

Shi JongLeem, etc. "The effect o fthe low-mole InGaN structure and InGaN/GaN strained layer superlattices on optical performance of multiple quantum well active layers" Journal of Crystal Growth 311 (2008) 103-106.*
W.V.Lundin, etc. "Single quantumwelldeep-greenLEDswithburiedInGaN/GaN short-periodsuperlattice", available online Sep. 22, 2010, Journal of Crystal Growth 315 (2011) 267-271.*
Frank Lu, etc. "Blue LED growth from 2 inch to 8 inch", Science China, Technological Sciences, Jan. 2011 vol. 54 No. 1: 33-37.*
Shi Jong Leem, etc. "The effect o fthe low-mole InGaN structure and InGaN/GaN strained layer superlattices on optical performance of multiple quantum well active layers" Journal of Crystal Growth 311 (2008) 103-106.*
K P O'Donnell etc., "Structural analysis of InGaN epilayers", J. Phys.: Condens. Matter 13 (2001) 6977-6991.*
"Single quantum well deep-green LEDs with buried InGaNGaN short-period superlattice" by Lundin, Journal of Crystal Growth 315 (2011) 267-271 (Available online Sep. 22, 2010).*
"The effect of the low-mole InGaN structure and InGaN/GaN strained layer" by Leem, Journal of Crystal Growth 311 (2008)103-106.*
"Formation and structure of inverted hexagonal pyramid defects in multiple quantum wells InGaN/GaN" by Watanable in Appl. Phys. Lett., vol. 82, No. 5, Feb. 3, 2003.*
Hangleiter, A. et al. "Suppression of Nonradiative Recombination by V-Shaped Pits in GaInN/GaN Quantum Wells Produces a Large Increase in the Light Emission Efficiency," Physical Review Letters, PRL 95, Sep. 16, 2005, 4 pgs.
International Search Report mailed on Mar. 12, 2013, directed to International Application No. PCT/JP2012/081486, 1 pg.

* cited by examiner

FIG.7
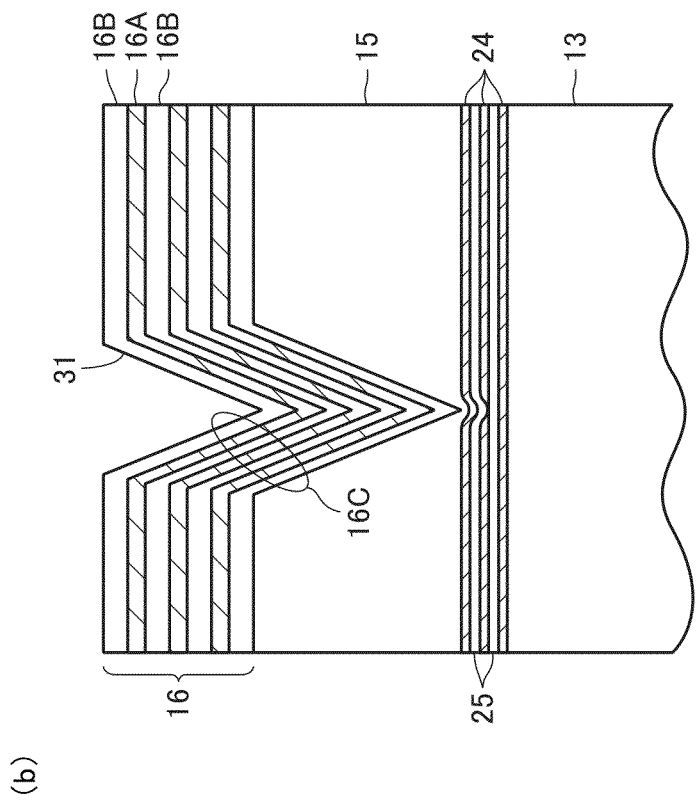
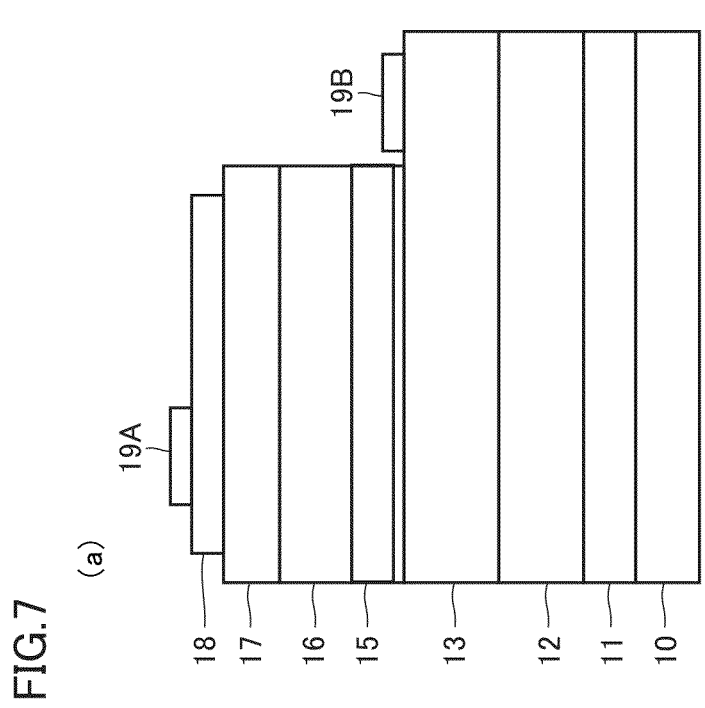

NITRIDE SEMICONDUCTOR LIGHT-EMITTING DEVICE AND METHOD OF MANUFACTURING THE SAME

CROSS-REFERENCE TO RELATED APPLICATIONS

This application is a national phase filing under 35 U.S.C. §371 of International Application No. PCT/JP2012/081486, filed on Dec. 5, 2012, which claims priority to Japanese Patent Application No. 2011-266822, filed on Dec. 6, 2011, the contents of which prior applications are incorporated herein by reference.

FIELD OF THE INVENTION

The present invention relates to nitride semiconductor light-emitting devices and methods of manufacturing the same.

BACKGROUND OF THE INVENTION

Group III-V compound semiconductors containing nitrogen (hereinafter referred to as "nitride semiconductors") have a band gap energy corresponding to the energy of light having a wavelength in the infrared region to the ultraviolet region, and are therefore useful as a material for a light-emitting device that emits light having a wavelength in the infrared region to the ultraviolet region or a material for a light-receiving device that receives light having a wavelength in the infrared region to the ultraviolet region.

The nitride semiconductors also have strongly bonded atoms that form the nitride semiconductors, a high breakdown voltage and a high saturation electron velocity, and are therefore also useful as a material for an electronic device such as a high-temperature-resistant, high-output and high-frequency transistor.

Furthermore, the nitride semiconductors hardly damage the environment and have been receiving attention as easy to handle material.

In a nitride semiconductor light-emitting device including such a nitride semiconductor, a quantum well structure is generally employed as a light-emitting layer. When a voltage is applied, electrons and holes flow into the light-emitting layer by diffusion and recombine in a well layer of the light-emitting layer, thus producing light.

There have been reports that the emission intensity of an InGaN-based LED (Light-Emitting Diode) is increased by insertion of a strained-layer superlattice (hereinafter referred to as "SLS") structure made of InGaN/GaN immediately below multi-quantum wells (hereinafter referred to as "MQWs"). The details of this physical phenomenon are unclear, however. It is also unclear whether or not the emission intensity of an LED depends on the number of repeated cycles in the SLS structure.

It is known that defects in the form referred to as V-pits (V-shaped pits) are present in a nitride semiconductor structure. For example, PTD 1 (Japanese Patent Laying-Open No. 2005-277423) discloses a structure in which a "hexagonal pyramid cavity" is formed in a surface of an LED chip.

Since the V-pits are defects, it is generally believed that the characteristics of an LED will be improved if the generation of the V-pits is suppressed. On the other hand, NPD 1 (A. Hangleiter, F. Hitzel, C. Netzel, D. Fuhrmann, U. Rossow, G. Ade, and P. Hinze, "Suppression of Nonradiative Recombination by V-Shaped Pits in GaInN/GaN Quantum Wells Produces a Large Increase in the Light Emission Efficiency", Physical Review Letters 95, 127402 (2005)) reports the action of V-pits in MQWs. According to this report, the presence of V-pits in MQWs leads to narrow quantum wells in the inclined faces of the V-pits, and thus increases an effective band gap due to the effect of an increased quantum level energy and the like. Consequently, electrons and holes in the quantum wells are prevented from reaching the inside of the V-pits, whereby nonradiative recombination in the MQWs is suppressed.

PATENT DOCUMENT

PTD 1: Japanese Patent Laying-Open No. 2005-277423

NON PATENT DOCUMENT

NPD 1: A. Hangleiter, F. Hitzel, C. Netzel, D. Fuhrmann, U. Rossow, G. Ade, and P. Hinze, "Suppression of Nonradiative Recombination by V-Shaped Pits in GaInN/GaN Quantum Wells Produces a Large Increase in the Light Emission Efficiency", Physical Review Letters 95, 127402 (2005)

SUMMARY OF THE INVENTION

There is a need for further improvement in luminous efficiency of a nitride semiconductor light-emitting device.

The present invention was made in view of such a point, and an object of the present invention is to provide a nitride semiconductor light-emitting device having a high luminous efficiency.

The present invention is based on the notion that the luminous efficiency of a nitride semiconductor light-emitting device can be improved if V-pits of a prescribed size are formed in a light-emitting layer. Specifically, a first nitride semiconductor light-emitting device according to the present invention is formed of an n-type nitride semiconductor layer, a trigger layer, a V-pit expanding layer, a light-emitting layer, and a p-type nitride semiconductor layer provided in this order. The light-emitting layer has a V-pit formed therein. The trigger layer is made of a nitride semiconductor material having a lattice constant different from that of a material that forms an upper surface of the n-type nitride semiconductor layer. The V-pit expanding layer is made of a nitride semiconductor material having a lattice constant substantially identical to that of the material that forms the upper surface of the n-type nitride semiconductor layer, and the V-pit expanding layer has a thickness of 5 nm or more and 5000 nm or less.

A second nitride semiconductor light-emitting device according to the present invention is formed of an n-type nitride semiconductor layer, a trigger layer, a V-pit expanding layer, a light-emitting layer, and a p-type nitride semiconductor layer provided in this order. The light-emitting layer has a V-pit formed therein. The trigger layer is made of a nitride semiconductor material having a lattice constant different from that of a material that forms an upper surface of the n-type nitride semiconductor layer. The V-pit expanding layer is made of a nitride semiconductor material having a lattice constant substantially identical to that of the material that forms the upper surface of the n-type nitride semiconductor layer, and the V-pit expanding layer has a thickness such that the V-pit in an upper surface of the light-emitting layer has a diameter of 86 nm or more.

Preferably, the light-emitting layer is formed of a well layer and a barrier layer stacked on each other. In this case, preferably, the trigger layer has a band gap energy larger than that of the well layer.

When the upper surface of the n-type nitride semiconductor layer is made of GaN, the well layer may be made of $In_xGa_{1-x}N$ (0.01≤x<1), and the trigger layer may be made of $In_yGa_{1-y}N$ (0.01≤y≤x).

When the upper surface of the n-type nitride semiconductor layer is made of GaN, the V-pit expanding layer may be made of GaN.

Preferably, the trigger layer has a thickness of 20 nm or less.

In a method of manufacturing the nitride semiconductor light-emitting device according to the present invention, when the trigger layer is made of InGaN, it is desirable that a growth temperature of the trigger layer be equal to or lower than a growth temperature of the n-type nitride semiconductor layer, and a growth temperature of the V-pit expanding layer be equal to or higher than the growth temperature of the trigger layer.

In the nitride semiconductor light-emitting device according to the present invention, the trigger layer starts forming the V-pit and the V-pit expanding layer increases the diameter of the V-pit, thus causing the light-emitting layer to be formed also on a sidewall of the V-pit having a prescribed size. In the portion of this sidewall of the V-pit, the band gap is effectively increased due to the effect of a changed composition of the well layer or the effect of an increased quantum level energy because of a small thickness of the well layer. Consequently, the injection of carriers into a threading dislocation present below the V-pit is suppressed, which is thought to eventually improve the luminous efficiency. Accordingly, nonradiative recombination in the light-emitting layer is suppressed, whereby a nitride semiconductor light-emitting device having a high luminous efficiency can be provided.

BRIEF DESCRIPTION OF THE DRAWINGS

FIG. 7(a) is a schematic cross-sectional view of a nitride semiconductor light-emitting device according to another embodiment of the present invention.

FIG. 7(b) is a cross-sectional view of a substantial part of FIG. 7(a).

DETAILED DESCRIPTION OF THE INVENTION

The following discusses experiments and results thereof that led to the completion of the present invention before discussing a nitride semiconductor light-emitting device and a method of manufacturing the same according to the present invention.

First, the present inventors conducted the following experiments in order to clarify the effect of an SLS layer.

Figure 1:
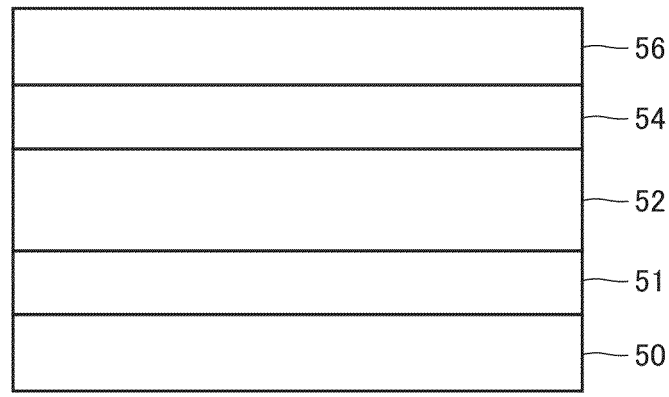
FIG. 1 is a schematic cross-sectional view of evaluation samples for determining the effect of an SLS layer.

For the purpose of evaluating whether or not the size and the like of a V-pit depend on the number of repeated cycles in an SLS layer without light emission by current application, four types of evaluation samples were made by MOVPE (Metal Organic Vapor Phase Epitaxy). FIG. 1 is a schematic cross-sectional view of the made evaluation samples. In the four types of evaluation samples, the number of repeated cycles in the SLS layer (the number of repeated cycles in the SLS layer herein being defined by the number of $In_{0.1}Ga_{0.9}N$ layers forming the SLS layer) was 0, 5, 10 and 20, respectively.

Specifically, a GaN buffer layer 51 was grown to a thickness of 25 nm on a c-plane sapphire substrate 50 at a pressure of 100 kPa, at a temperature of 460° C., and at a molar ratio of a Group V element material to a Group III element material (hereinafter referred to as "V/III ratio") of 40677. Then, an undoped GaN layer 52 was grown to a thickness of 2.4 μm at a temperature of 1150° C. and a V/III ratio of 2536. $H_2$ was used as a carrier gas.

N cycles (N=0, 5, 10, 20) of an $In_xGa_{1-x}N$ layer (x=0.09, 2.5 nm thick) and a GaN layer (2.5 nm thick) were stacked at a lowered growth temperature of 820° C. and a V/III ratio of 6517. $N_2$ was used as a carrier gas. An SLS layer 54 was thus formed.

Four cycles of a well layer made of $In_xGa_{1-x}N$ (x=0.15, 3 nm thick) and a barrier layer made of GaN (12.5 nm thick) were alternately grown ((the number of $In_{0.15}Ga_{0.85}N$ well layers being 4)) at a growth temperature of 780° C. and a V/III ratio of 6517. $N_2$ was used as a carrier gas. An MQW layer 56 was thus formed. The evaluation samples shown in FIG. 1 were thus obtained. That is, since the evaluation samples are not caused to emit light by current application, the evaluation samples were made without an n-type nitride semiconductor layer, a p-type nitride semiconductor layer, an n-side electrode and a p-side electrode.

Figure 2:
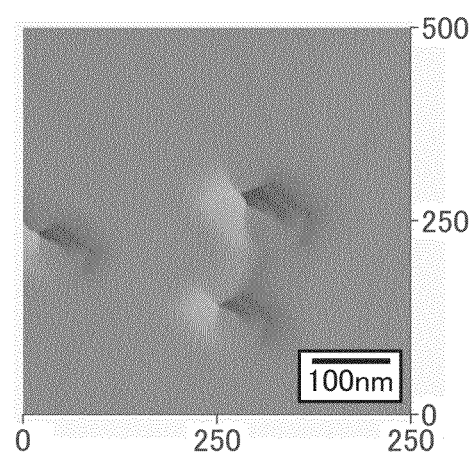
FIG. 2 shows a differential image of an AFM (Atomic Force Microscopy) image of the evaluation sample.

The obtained evaluation samples were subjected to AFM measurement to obtain differential images thereof. FIG. 2 shows a differential image of an AFM image of the evaluation sample in which the number of repeated cycles in the SLS layer was 20. As shown in FIG. 2, it can be confirmed that V-pits (which include those having shapes different from an ideal V-shape in longitudinal section) are formed surrounded by facets different from the c-plane of sapphire substrate 50.

Figure 3:
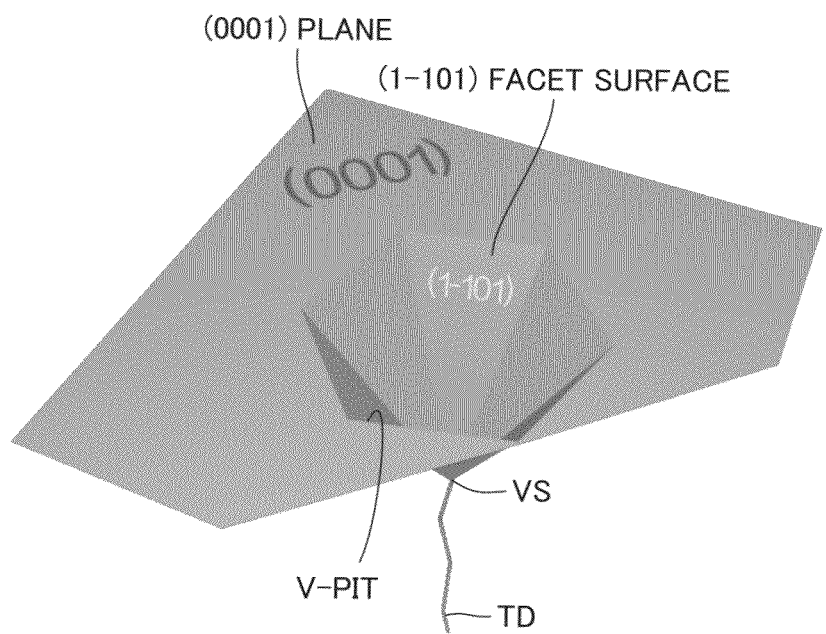
FIG. 3 is a schematic perspective view of a V-pit.

FIG. 3 is a schematic perspective view of a V-pit. A threading dislocation TD extends from below a nitride semiconductor crystal in a growth direction (+c-axis direction), and a V-pit is formed from a starting point VS (near a strained layer above threading dislocation TD). Ideally, the V-pit is surrounded by six inclined faces (facets). Since a crystal plane having a plane index of {1-101} appears on the facets, the V-pit is inclined at a constant angle relative to the (0001) crystal plane. The actual V-pit is merely a randomly formed hole or pit as shown in FIG. 2, and often does not have the ideal shape such as that shown in FIG. 3.

From the obtained AFM image, a number density of the V-pits in an upper surface of MQW layer 56 was calculated, and a diameter of the V-pits (hereinafter referred to as "V-pit diameter") on the upper surface of MQW layer 56 was obtained. When the V-pits in the upper surface of MQW layer 56 had an outer shape different from a circular shape, the diameter was measured by approximating the outer shape of the V-pits in the upper surface of MQW layer 56 to a circular shape. Then, relation between the number of repeated cycles in SLS layer 54, and the number density of the V-pits and the V-pit diameter was determined. The results are shown in FIG. 4 and Table 1.

TABLE 1

|  | Number N of repeated cycles in SLS layer | | | |
| --- | --- | --- | --- | --- |
|  | 0 | 5 | 10 | 20 |
| V-pit diameter (nm) | 51.47 | 86.40 | 115.44 | 213.24 |
| Number density of V-pits (cm$^{-2}$) | $2.24 \times 10^8$ | $2.28 \times 10^8$ | $2.32 \times 10^8$ | $2.64 \times 10^8$ |

Figure 4:
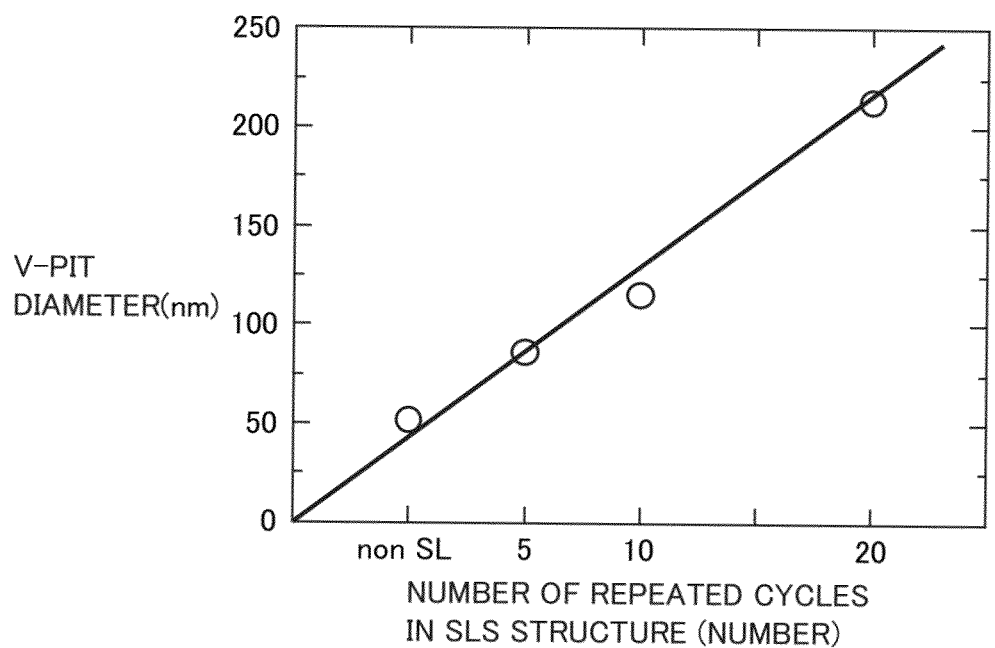
FIG. 4 is a graph showing relation between the number of repeated cycles in the SLS layer and a diameter of the V-pit (V-pit diameter).

It was confirmed from FIG. 4 and Table 1 that the number density of the V-pits does not vary greatly whereas the V-pit diameter increases, with an increase in the number of repeated cycles in SLS layer 54. It thus became obvious that the insertion of the SLS structure into the nitride semiconductor light-emitting device triggers the start of formation of the V-pits, and that the V-pit diameter increases as the thickness of SLS layer 54 increases. This is thought to be contributing to some degree to improvement in IQE (Internal Quantum Efficiency) and EQE (External Quantum Efficiency).

From the above results of observation of V-pits, the present inventors think that, in a nitride semiconductor layer, a threading dislocation that extends from a portion in the vicinity of an interface between the nitride semiconductor layer and a substrate or a threading dislocation that occurs during crystal growth and extends upward generates a V-pit in an SLS layer, and the generated V-pit is increased by a thickness corresponding to the thickness of the SLS layer while maintaining an inclined facet structure by low temperature growth. Since a V-pit holds inclined facets having a plane orientation different from the c-plane which is parallel to a surface of the substrate, an MQW layer on the SLS layer includes a portion that grows on the inclined facets. In this portion, the effective band gap is increased due to the effect of a changed composition of an InGaN well layer or the effect of an increased quantum level energy because of a small thickness of the well layer. Consequently, the injection of carriers into a threading dislocation present below the V-pit is suppressed in the MQW layer, which is thought to eventually improve the luminous efficiency. Thus, a nitride semiconductor light-emitting device including an SLS layer was made and its characteristics were examined.

Figure 5:
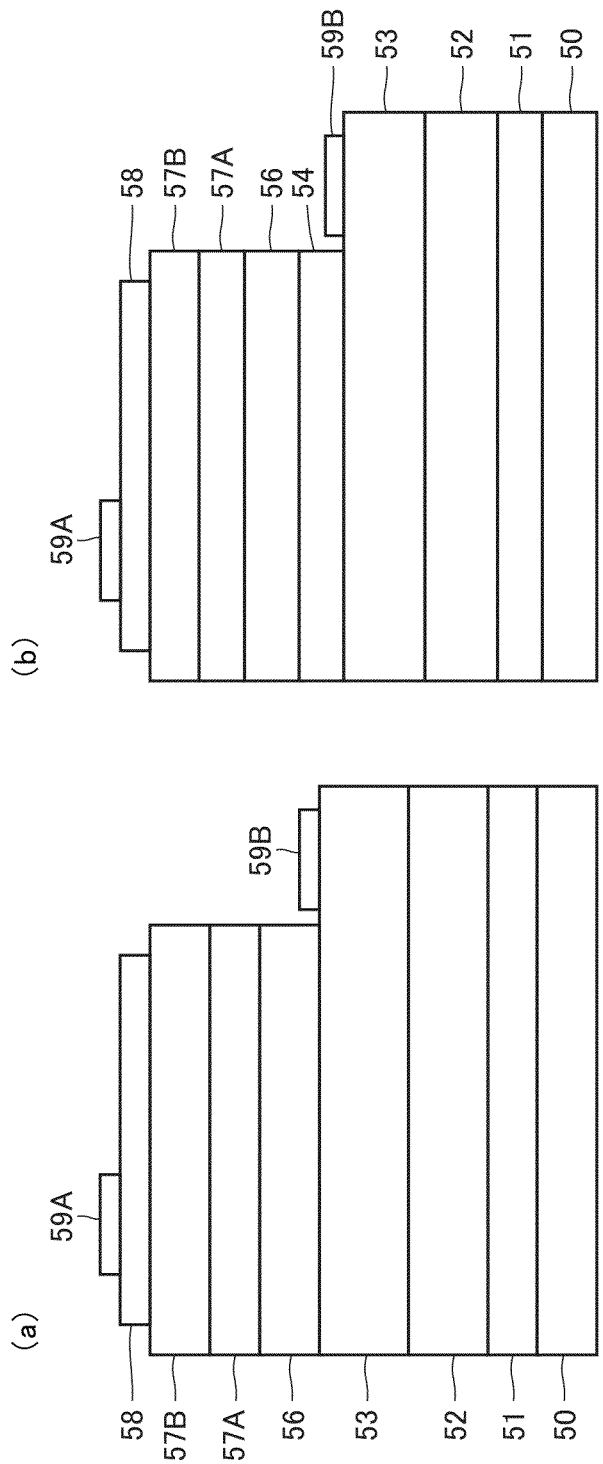
FIG. 5(a) is a schematic cross-sectional view of a nitride semiconductor light-emitting device not including an SLS layer.
FIG. 5(b) is a schematic cross-sectional view of a nitride semiconductor light-emitting device including an SLS layer.

Nitride semiconductor light-emitting devices shown in FIGS. 5(a) to (b) were used to examine LED characteristics. FIG. 5(a) is a schematic cross-sectional view of a nitride semiconductor light-emitting device not including an SLS layer, and FIG. 5(b) is a schematic cross-sectional view of a nitride semiconductor light-emitting device including an SLS layer (the number of repeated cycles being 10). Methods of making the nitride semiconductor light-emitting devices shown in FIGS. 5(a) to (b) will be described below.

GaN buffer layer 51, undoped GaN layer 52, an n-type GaN layer 53, SLS layer 54, MQW layer 56, a p-AlGaN layer 57A and a p-GaN layer 57B were grown by MOVPE on c-plane sapphire substrate 50 having a flat surface, to obtain a wafer.

Specifically, GaN buffer layer 51 was grown to a thickness of 25 nm on c-plane sapphire substrate 50 at a pressure of 100 kPa, at a temperature of 460° C., and at a V/III ratio of 40677. Then, undoped GaN layer 52 was grown to a thickness of 2.4 μm at a temperature of 1150° C. and a V/III ratio of 2536. $H_2$ was used as a carrier gas. Thereafter, the Si-doped n-type GaN layer was grown to a thickness of 2.5 μm. The n-type doping concentration was $4.41 \times 10^{18}$ cm$^{-3}$.

N cycles (N=0, 10) of a Si-doped $In_xGa_{1-x}N$ layer (x=0.09, 2.5 nm thick) and a GaN layer (2.5 nm thick) were stacked at a lowered growth temperature of 820° C. and a V/III ratio of 6517, to grow SLS layer 54. The n-type doping concentration was $6 \times 10^{17}$ cm$^{-3}$. $N_2$ was used as a carrier gas.

Six cycles of a well layer (3 nm thick) made of $In_xGa_{1-x}N$ (x=0.15) and a barrier layer (12.5 nm thick) made of GaN were grown at a growth temperature of 780° C. and a V/III ratio of 6517, to form MQW layer 56. $N_2$ was used as a carrier gas.

Mg-doped p-$Al_xGa_{1-x}N$ layer (x=0.2, 20 nm thick) 57A and p-GaN layer (100 nm thick) 57B were successively grown at a growth temperature of 1100° C. and a V/III ratio of 4405. $H_2$ was used as a carrier gas. A wafer was thus obtained.

The obtained wafer was annealed for 30 seconds at 1000° C. in a nitrogen atmosphere. Then, an ITO (Indium Tin Oxide) film 58 was formed on the entire upper surface of the wafer. Thereafter, etching was performed so as to expose n-GaN layer 53 and to leave a mesa portion (remaining portion which was not etched).

A p-side electrode 59A formed of an Au layer and a Cr layer stacked on each other was formed on ITO film 58. An n-side electrode 59B was formed by successively stacking a Cr layer and an Au layer on n-GaN layer 53 exposed by the etching. Both p-side electrode 59A and n-side electrode 59B had an electrode diameter of about 86 μm.

With a prober being applied to both p-side electrode 59A and n-side electrode 59B, a forward driving voltage $V_F$ (V) was measured by applying a forward current (having a current value of 20 mA), a reverse driving voltage $V_R$ (V) was measured by applying a reverse current (having a current value of −10 μA), a leak current $I_R$ (μA) was measured by applying a reverse voltage (having a voltage value of −5 V), and an emission intensity $V_L$ was measured by applying a forward current (having a current value of 20 mA). In addition, an emission spectrum was measured by applying a forward current (having a current value of 20 mA), to obtain an emission peak wavelength $\lambda_p$ (nm). These results are shown in Table 2.

TABLE 2

|  | $V_F$ (V) (20 mA) | $V_R$ (V) (−10 μA) | $I_R$ (μA) (−5 V) | Emission intensity (20 mA) | $\lambda_p$ (nm) |
| --- | --- | --- | --- | --- | --- |
| Structure shown in FIG. 5(a) (N = 0) | 3.85 | 10.0 | 0.14 | 159.1 | 450.8 |
| Structure shown in FIG. 5(b) (N = 10) | 3.54 | 10.0 | 0.28 | 253.7 | 448.2 |

After the measurements with the prober were completed, the wafer was divided into pieces each having a size of 350× 350 μm. The piece was mounted on a TO-18 package for characteristics evaluation, and both p-side electrode 59A and n-side electrode 59B were wire bonded to the terminals of the TO-18 package. After a current was applied between p-side electrode 59A and n-side electrode 59B through the terminals of the TO-18 package, emission peak wavelength $\lambda_p$ (nm), forward driving voltage $V_F$ (V) and an external quantum efficiency $\eta_{ext}$ were measured using an integrating sphere. These results are shown in Table 3.

TABLE 3

|  | $\lambda_p$ (nm) | $V_F$ (V) | $\eta_{ext}$ (%) |
| --- | --- | --- | --- |
| Structure shown in FIG. 5(a) (N = 0) | 458.7 | 3.87 | 4.50 |
| Structure shown in FIG. 5(b) (N = 10) | 449.0 | 3.68 | 9.93 |

As shown in Table 2, in the nitride semiconductor light-emitting device shown in FIG. 5(b), leak current $I_R$ during reverse bias increased slightly, but there was little variation observed in peak wavelength $\lambda_p$ by the insertion of the SLS layer, forward driving voltage $V_F$ decreased, and the emission intensity increased by a factor of 1.6, as compared to the nitride semiconductor light-emitting device shown in FIG. 5(a).

As shown in Table 3, in the nitride semiconductor light-emitting device shown in FIG. 5(b), peak wavelength $\lambda_p$ was shifted toward a short wavelength by about 10 nm, but external quantum efficiency $\eta_{ext}$ was improved by a factor of 2.2, as compared to the nitride semiconductor light-emitting device shown in FIG. 5(a).

The present inventors also confirmed that the V-pit diameter is 86 nm or more if the number of repeated cycles in the SLS layer, one cycle being 5 nm, for example, was 5 or more.

As described above, the insertion of the SLS layer below the MQW layer leads to increased emission intensity and improved EQE, but causes an increase in leak current $I_R$ during reverse bias. The present inventors conducted dedicated studies and completed the present invention by finding a structure of a nitride semiconductor light-emitting device capable of attaining increased emission intensity and improved luminous efficiency without an increase in leak current $I_R$ during reverse bias. The following discusses embodiments of the present invention with reference to the drawings. It should be noted that the present invention is not limited to the following embodiments.

Figure 6:
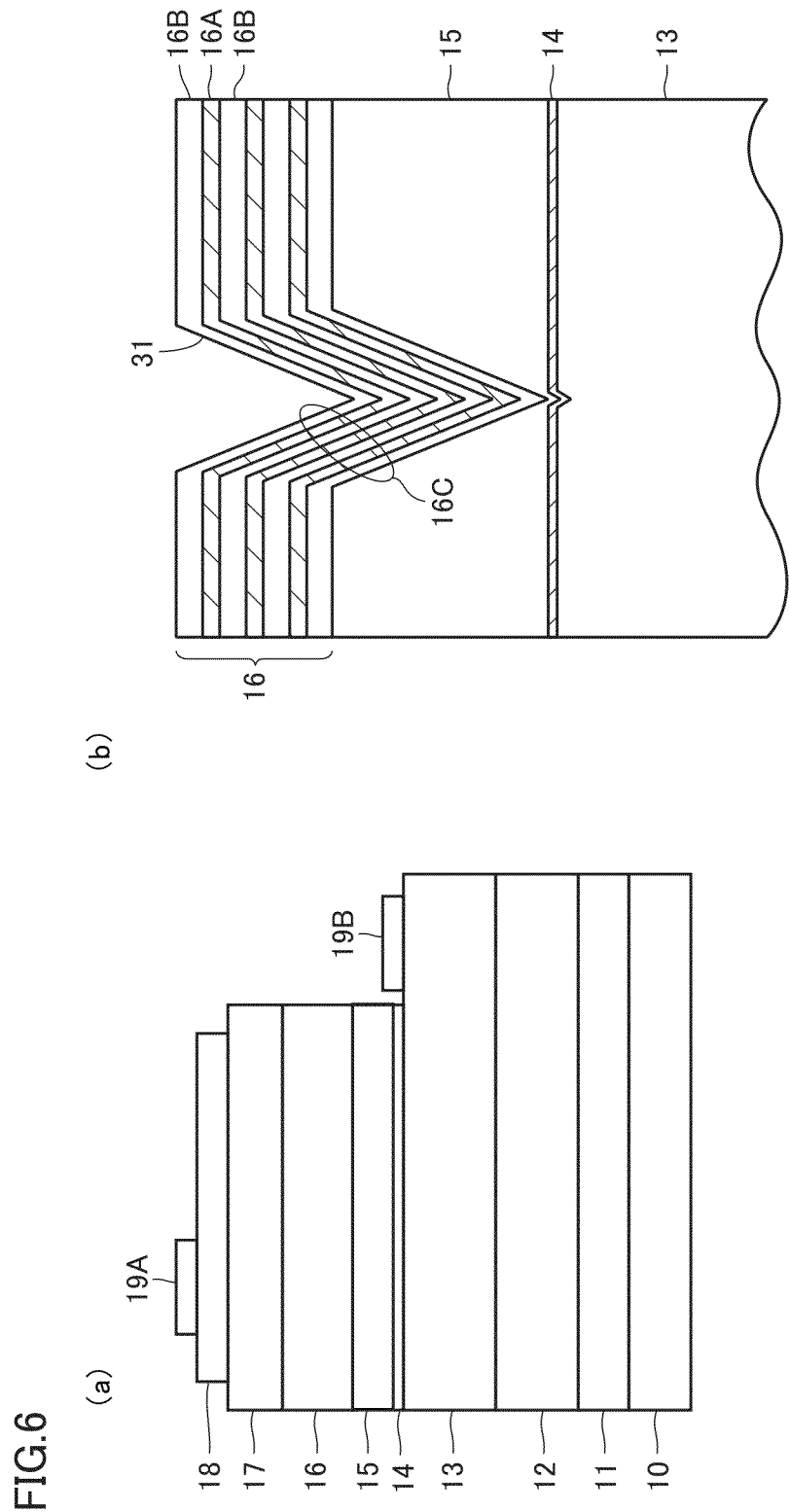
FIG. 6(a) is a schematic cross-sectional view of a nitride semiconductor light-emitting device according to one embodiment of the present invention.
FIG. 6(b) is a cross-sectional view of a substantial part of FIG. 6(a).

FIG. 6(a) is a schematic cross-sectional view of a nitride semiconductor light-emitting device according to a first embodiment of the present invention, and FIG. 6(b) is an enlarged cross-sectional view of a substantial part of the nitride semiconductor light-emitting device according to this embodiment. The nitride semiconductor light-emitting device according to this embodiment includes a buffer layer 11, a base layer 12, an n-type nitride semiconductor layer 13, a trigger layer 14, a V-pit expanding layer 15, an MQW layer 16, and a p-type nitride semiconductor layer 17 provided in this order on a substrate 10. A p-side electrode 19A is provided on p-type nitride semiconductor layer 17 with a transparent electrode 18 interposed therebetween. A portion of an upper surface of n-type nitride semiconductor layer 13 is exposed by etching, with an n-side electrode 19B being provided on the exposed portion.

Substrate 10 may be, for example, an insulative substrate made of sapphire, or a conductive substrate made of GaN, SiC or ZnO. The thickness of substrate 10 during growth is set between 300 μm and 2000 μm, for example. The thickness of substrate 10 of the nitride semiconductor light-emitting device is set to 120 μm, and may be, but not particularly limited to, 50 μm or more and 300 μm or less, for example. An upper surface of substrate 10 may be even or uneven in shape. A structure in which the structure has been removed by a laser lift-off process may be used.

When a different type of substrate such as a sapphire substrate is used, buffer layer 11 may be an $Al_{s0}Ga_{t0}N$ ($0 \leq s0 \leq 1$, $0 \leq t0 \leq 1$, $s0+t0 \neq 0$) layer, for example, and is preferably an AlN layer or a GaN layer. A small part (0.5 to 2%) of N may be substituted by oxygen. As a result, buffer layer 11 is formed to extend in a normal direction of the growth surface of substrate 10, whereby buffer layer 11 formed of an assembly of columnar crystals having uniform crystal grains is obtained.

The thickness of buffer layer 11 may be, but not particularly limited to, 3 nm or more and 100 nm or less, and is preferably 5 nm or more and 50 nm or less.

Base layer 12 may be an $Al_{s1}Ga_{t1}In_{u1}N$ ($0 \leq s1 \leq 1$, $0 \leq t1 \leq 1$, $0 \leq u1 \leq 1$, $s1+t1+u1 \neq 0$) layer, for example, and is preferably an $Al_{s1}Ga_{t1}N$ ($0 \leq s1 \leq 1$, $0 \leq t1 \leq 1$, $s1+t1 \neq 0$) layer, more preferably a GaN layer. As a result, crystal defects (such as dislocations) present in buffer layer 11 are more likely to be looped near an interface between buffer layer 11 and base layer 12, whereby the transfer of the crystal defects from buffer layer 11 to base layer 12 can be prevented.

When an insulative substrate such as a sapphire substrate is used, base layer 12 may contain an n-type impurity. However, high crystallinity of base layer 12 can be maintained when base layer 12 does not contain an n-type impurity. Thus, base layer 12 preferably does not contain an n-type impurity.

Although defects in base layer 12 are reduced by increasing the thickness of base layer 12, the effect of reducing the defects in base layer 12 is saturated when the thickness of base layer 12 is increased above a certain level. Thus, the thickness of base layer 12 is preferably 1 μm or more and 8 μm or less.

N type nitride semiconductor layer 13 may be an $Al_{s2}Ga_{t2}In_{u2}N$ ($0 \leq s2 \leq 1$, $0 \leq t2 \leq 1$, $0 \leq u2 \leq 1$, $s2+t2+u2 \approx 1$) layer doped with an n-type impurity, for example, and is preferably an $Al_{s2}Ga_{1-s2}N$ ($0 \leq s2 \leq 1$, preferably $0 \leq s2 \leq 0.5$, more preferably $0 \leq s2 \leq 0.1$) layer doped with an n-type impurity.

The n-type dopant may be, but not particularly limited to, Si, P, As, Sb or the like, and is preferably Si. This also applies to the respective layers which will be described later.

The n-type doping concentration in n-type nitride semiconductor layer 13 may be, but not particularly limited to, $1 \times 10^{19}$ $cm^{-3}$ or less.

N type nitride semiconductor layer 13 preferably has a large thickness because its resistance decreases as the thickness of n-type nitride semiconductor layer 13 increases. However, increasing the thickness of n-type nitride semiconductor layer 13 results in increased costs. In view of this tradeoff, the thicknesses of n-type nitride semiconductor layer 13 may be practically, but not particularly limited to, 1 μm or more and 10 μm or less.

N type nitride semiconductor layer 13 may have a structure of two or more stacked layers. The layers may have the same composition or different compositions. The layers may have the same film thickness or different film thicknesses.

Trigger layer 14 functions as a layer that triggers the formation of a V-pit 31 in MQW layer 16. V-pit 31 is a type of crystal defects. As was discussed in <Experiments for Determining Effect of SLS Layer> above, V-pit 31 includes not only a V-pit having an ideal V-shape in longitudinal section, but also a V-pit having a shape different from the ideal V-shape in longitudinal section.

Specifically, trigger layer 14 may be made of a nitride semiconductor material having a lattice constant different from that of a material that forms the upper surface of n-type nitride semiconductor layer 13. When n-type nitride semiconductor layer 13 and trigger layer 14 have different lattice constants, strain caused by the difference in lattice constant occurs in trigger layer 14. This strain is thought to act as a trigger for the generation of V-pit 31. In order for this event to occur, the upper surface of n-type nitride semiconductor layer 13 and trigger layer 14 may have different types of components. Namely, that "trigger layer 14 is made of a nitride semiconductor material having a lattice constant different from that of a material that forms the upper surface of n-type nitride semiconductor layer 13" means that the upper surface of n-type nitride semiconductor layer 13 and trigger layer 14 have different types of components. For example, when n-type nitride semiconductor layer 13 is made of GaN, trigger layer 14 may be made of $In_yGa_{1-y}N$ ($0.01 \leq y \leq 1$), $Al_zGa_{1-z}N$ ($0.01 \leq z \leq 1$) or the like.

Trigger layer 14 preferably has a band gap energy larger than that of a well layer 16A which will be described in <MQW Layer> below. As a result, the absorption of light emitted from well layer 16A into trigger layer 14 can be prevented. Considering that the band gap energy of a nitride semiconductor layer increases with a decrease in In composition ratio in the layer, when trigger layer 14 is made of $In_yGa_{1-y}N$, the In composition ratio y is preferably lower than the In composition ratio in well layer 16A.

The thickness of trigger layer 14 is preferably, but not particularly limited to, a thickness such that trigger layer 14 is coherently grown (strain that has occurred in trigger 14 is not relaxed) without causing crystal defects, and more preferably 20 nm or less, further preferably 10 nm or less. The nitride semiconductor light-emitting device according to this embodiment, however, may include an example where the strain is slightly relaxed by trigger layer 14.

V-pit expanding layer 15 is provided to increase the V-pit diameter, preferably to increase the V-pit diameter to 86 nm or more, more preferably to increase the V-pit diameter to 100 nm or more. As was discussed in <Experiments for Determining Effect of SLS Layer> above, the V-pit diameter is the diameter of V-pit 31 in the upper surface of MQW layer 16, and when V-pit 31 in the upper surface of MQW layer 16 has an outer shape different from a true circle, it is the diameter obtained by approximating the outer shape of V-pit 31 in the upper surface of MQW layer 16 to a circular shape.

As was discussed in <Experiments for Determining Effect of SLS Layer> above, it is considered that the V-pit diameter increases as the thickness of V-pit expanding layer 15 increases. Thus, V-pit expanding layer 15 may have a thickness such that the V-pit diameter is 86 nm or more. Specifically, the thickness of V-pit expanding layer 15 may be 5 nm or more and 5000 nm or less, and is preferably 25 nm or more and 2500 nm or less. If the thickness of V-pit expanding layer 15 is less than 5 nm, it may be difficult to increase the V-pit diameter to about 86 nm. If the thickness of V-pit expanding layer 15 is more than 5000 nm, on the other hand, the V-pit diameter increases too much to reduce the area of a portion of MQW layer 16 that actually contributes to light emission, which may result in lowered luminous efficiency instead.

As was discussed in <Experiments for Determining Effect of SLS Layer> above, V-pit diameter increases, by crystal growth, by a thickness corresponding to the thickness of V-pit expanding layer 15 while maintaining an inclined facet structure. It is thus thought that V-pit 31 becomes deeper as the V-pit diameter increases. If the V-pit diameter is 86 nm or more, a starting point of V-pit 31 is located below MQW layer 16, and an MQW layer 16C including a well layer having a large effective band gap is formed also on a sidewall of the V-pit. Consequently, the injection of carriers into threading dislocation TD can be suppressed to improve the luminous efficiency.

Moreover, by using the structure that combines trigger layer 14 and V-pit expanding layer 15 instead of using only an SLS layer, the strain can be reduced to suppress the occurrence of new threading dislocations TD. Thus, an increase in the leak current during reverse bias can be prevented. Furthermore, V-pit 31 having a size equal to that in the structure of only an SLS layer can be formed, with a similar effect of suppressing nonradiative recombination.

V-pit expanding layer 15 is preferably made of a nitride semiconductor material having a lattice constant substantially the same as that of the material that forms the upper surface of n-type nitride semiconductor layer 13. That "V-pit expanding layer 15 is made of a nitride semiconductor material having a lattice constant substantially the same as that of the material that forms the upper surface of n-type nitride semiconductor layer 13" includes not only an example where the material that forms the upper surface of n-type nitride semiconductor layer 13 and the material that forms V-pit expanding layer 15 have the same lattice constant, but also an example where the material that forms the upper surface of n-type nitride semiconductor layer 13 and the material that forms V-pit expanding layer 15 have different lattice constants, but defects caused by the difference in lattice constant are not formed in V-pit expanding layer 15. In other words, that "V-pit expanding layer 15 is made of a nitride semiconductor material having a lattice constant substantially the same as that of the material that forms the upper surface of n-type nitride semiconductor layer 13" includes examples such as where the upper surface of n-type nitride semiconductor layer 13 and V-pit expanding layer 15 are different from each other only in the presence or absence of doping, and where the material that forms the upper surface of n-type nitride semiconductor layer 13 and the material that forms V-pit expanding layer 15 have the same types of components but different composition ratios of the components. For example, when n-type nitride semiconductor layer 13 is an n-type GaN layer, V-pit expanding layer 15 may be a non-doped GaN layer but is preferably an n-type GaN layer. It is believed that this can prevent the occurrence of new crystal defects caused by the provision of V-pit expanding layer 15, and eliminate new defects formed by the provision of trigger layer 14.

V-pit 31 is formed partially in MQW layer 16. That is, MQW layer 16C is formed also on the sidewall of V-pit 31. That V-pit 31 is partially formed means that V-pits 31 are observed as dots on the upper surface of MQW layer 16 with the AFM, and are not covering the entire upper surface. The number density of V-pits 31 is preferably $1 \times 10^8$ cm$^{-2}$ or more and $1 \times 10^{10}$ cm$^{-2}$ or less. V-pits 31 are formed in an MQW layer in conventional techniques, in which case the number density of V-pits 31 in an upper surface of the MQW layer is about less than $1 \times 10^8$ cm$^{-2}$.

As was discussed in <Experiments for Determining Effect of SLS Layer> above, most of V-pits 31 occur from threading dislocations TD. When MQW layer 16 is formed on the sidewall of V-pit 31, then threading dislocation TD exists at the bottom of V-pit 31. Thus, the injection of carriers into threading dislocation TD is suppressed. Accordingly, the luminous efficiency is improved.

That is, starting point VS of V-pit 31 preferably exists in a layer located below MQW layer 16. As a result, the probability of nonradiative recombination in MQW layer 16 can be reduced to suppress the lowering of luminous efficiency caused by threading dislocation TD.

As shown in FIG. 6(b), MQW layer 16 is formed by alternately stacking well layer 16A and a barrier layer 16B to sandwich well layer 16A between barrier layers 16B. MQW layer 16 may be formed by successively stacking one or more semiconductor layers different from well layer 16A and barrier layer 16B, well layer 16A, and barrier layer 16B. The length of one cycle of MQW layer 16 (a sum of the thickness of well layer 16A and the thickness of barrier layer 16B) is, for example, 5 nm or more and 100 nm or less in a region where the V-pit is not formed.

The composition of each well layer 16A is adjusted in accordance with the emission wavelength required of the nitride semiconductor light-emitting device according to this embodiment, and may be, for example, $Al_cGa_dIn_{(1-c-d)}N$ ($0 \leq c < 1$, $0 < d \leq 1$), preferably an $In_xGa_{(1-x)}N$ ($0.01 \leq x \leq 1$) layer not containing Al. However, when ultraviolet emission of 375 nm or less is conducted, for example, Al is generally contained as appropriate so as to increase the band gap. Well layers 16A preferably have the same composition, so that the light emitted by a recombination of electrons and holes in well layers 16A can have the same wavelength, whereby an emission spectrum width of the nitride semiconductor light-emitting device is advantageously narrowed. Upper well layers 16A, for example, preferably contain the least amount of dopant (a dopant material is not introduced during growth), whereby nonradiative recombination in well layers 16A is suppressed to improve the luminous efficiency. On the other hand, lower well layers 16A may contain an n-type dopant, whereby a driving voltage of the light-emitting device tends to decrease.

The thicknesses of well layers 16A are more preferably, but not limited to be, identical to each other. If well layers 16A have the same thickness, they also have the same quantum level and emit light at the same wavelength by a recombination of electrons and holes therein, whereby the emission spectrum width of the nitride semiconductor light-emitting device is advantageously narrowed. On the other hand, the emission spectrum width of the nitride semiconductor light-emitting device can be broadened by intentionally providing well layers 16A with different compositions or thicknesses, which may be preferable depending on the application for illumination purposes and the like.

The thickness of each well layer 16A is preferably 1 nm or more and 7 nm or less. If the thickness of each well layer 16A is outside of this range, the luminous efficiency tends to be lowered.

The composition of each barrier layer 16B preferably has a band gap energy larger than that of each well layer 16A, and may specifically be $Al_fGa_gIn_{(1-f-g)}N$ ($0 \leq f < 1$, $0 < g \leq 1$), and is more preferably $In_hGa_{(1-h)}N$ ($0 < h \leq 1$) not containing Al, or $Al_fGa_gIn_{(1-f-g)}N$ ($0 \leq f < 1$, $0 < g \leq 1$) having a lattice constant substantially the same as that of well layer 16A.

The thickness of each barrier layer 16B is preferably 1 nm or more and 20 nm or less, and more preferably 3 nm or more and 15 nm or less. While the driving voltage decreases as the thickness of each barrier layer 16B decreases, the luminous efficiency tends to be lowered if the thickness is extremely reduced.

The n-type doping concentration in each barrier layer 16B is not particularly limited. Preferably, lower barrier layers 16B among the plurality of barrier layers 16B are subjected to n-type doping, and upper barrier layers 16B are subjected to n-type doping in lower concentration or undoped. Each barrier layer 16B may be subjected to intentional n-type doping, or may contain a p-type dopant by thermal diffusion during growth of p-type nitride semiconductor layer 17.

The number of well layers 16A may be, but not particularly limited to, 2 or more and 20 or less, for example, and is preferably 3 or more and 15 or less, more preferably 4 or more and 12 or less.

P type nitride semiconductor layer 17 may be an $Al_{s4}Ga_{t4}In_{u4}N$ ($0 \leq s4 \leq 1$, $0 \leq t4 \leq 1$, $0 \leq u4 \leq 1$, $s4+t4+u4 \neq 0$) layer doped with a p-type dopant, for example, and is preferably an $Al_{s4}Ga_{1-s4}N$ ($0 < s4 \leq 0.4$, preferably $0.1 \leq s4 \leq 0.3$) layer doped with a p-type dopant. The p-type dopant is, but not particularly limited to, magnesium, for example.

The carrier concentration in p-type nitride semiconductor layer 17 is preferably $1 \times 10^{17}$ cm$^{-3}$ or more. Since an activation ratio of the p-type dopant is about 0.01, the p-type doping concentration (different from the carrier concentration) in p-type nitride semiconductor layer 17 is preferably $1 \times 10^{19}$ cm$^{-3}$ or more. However, the p-type doping concentration in a portion of p-type nitride semiconductor layer 17 near MQW layer 16 may be lower than this concentration.

The thickness of p-type nitride semiconductor layer 17 may be, but not particularly limited to, 50 nm or more and 300 nm or less. By reducing the thickness of p-type nitride semiconductor layer 17, a heating time during its growth can be shortened to suppress the diffusion of the p-type dopant into the MQW layer.

P type nitride semiconductor layer 17 may be formed of two or more stacked layers, and may be formed of, for example, a p-type AlGaN layer, a p-type GaN layer and a high-concentration p-type GaN layer stacked on one another.

P side electrode 19A and n-side electrode 19B are electrodes for supplying the nitride semiconductor light-emitting device with driving power. Although p-side electrode 19A and n-side electrode 19B include only a pad electrode portion in FIG. 6(a), they may be connected to an elongated projection (branch electrode) for current diffusion. An insulating layer for stopping the injection of current may be provided below p-side electrode 19A. The provision of this insulating layer allows for suppression of light emission immediately below p-side electrode 19A, thus reducing an amount of emitted light shielded by p-side electrode 19A. P side electrode 19A may be formed of, for example, a nickel layer, an aluminum layer, a titanium layer and a gold layer stacked in this order, and may have a thickness of about 1 µm. N side electrode 19B may be formed of, for example, a titanium layer, an aluminum layer and a gold layer stacked in this order, and may have a thickness of about 1 µm in view of the strength when wire bonding is performed. P side electrode 19A and n-side electrode 19B may have the same composition. Transparent electrode 18 may be formed of a transparent conductive film of ITO (Indium Tin Oxide) or IZO (Indium Zinc Oxide), for example, and may have a thickness of 20 nm or more and 200 nm or less.

Buffer layer 11, base layer 12 and n-type nitride semiconductor layer 13 are successively formed on substrate 10 by crystal growth. The conditions for the crystal growth of each layer are not particularly limited. The conditions for the crystal growth of each layer may be determined as appropriate depending on the material, thickness and the like of each layer.

Trigger layer 14 is formed on n-type nitride semiconductor layer 13 by crystal growth. The conditions for the crystal growth of trigger layer 14 may be, but not particularly limited to, a condition such that a growth temperature of trigger layer 14 is equal to or lower than a growth temperature of n-type nitride semiconductor layer 13. Particularly, when trigger layer 14 contains In, the growth temperature of trigger layer 14 is preferably lower than the growth temperature of n-type nitride semiconductor layer 13, and more preferably lower than the growth temperature of n-type nitride semiconductor layer 13 by 200° C. or more and 400° C. or less. As a result, trigger layer 14 has a lattice constant larger than that of n-type nitride semiconductor layer 13, thus triggering the formation of V-pit 31 surrounded by facets. Thus, MQW layer 16 is formed on the sidewall of V-pit 31 (facets of V-pit 31), whereby effective functioning of trigger layer 14 and V-pit expanding layer 15 becomes possible.

V-pit expanding layer 15 is formed on trigger layer 14 by crystal growth. The conditions for the crystal growth of V-pit expanding layer 15 may be, but not particularly limited to, a condition such that a growth temperature of V-pit expanding layer 15 is equal to or higher than the growth temperature of trigger layer 14, and preferably equal to or higher than the growth temperature of trigger layer 14 and equal to or lower than a temperature that is higher than the growth temperature of trigger layer 14 by 250° C. By setting a high growth temperature of V-pit expanding layer 15, V-pit expanding layer 15 having a high crystallinity can be formed. As a result, the lowering of crystallinity of MQW layer 16 provided on V-pit expanding layer 15 can be prevented to avoid the lowering of luminous efficiency. Furthermore, when a combination of trigger layer 14 and V-pit expanding layer 15 and a conventional SLS layer having equal thicknesses are compared together, new dislocations and the like are less likely to occur in the combination of trigger layer 14 and V-pit expanding layer 15, and a reduced leak current and improved luminous efficiency are observed in the combination when applied to an LED.

MQW layer 16 and p-type nitride semiconductor layer 17 are successively formed on V-pit expanding layer 15 by crystal growth. The conditions for the crystal growth of each layer are not particularly limited, and may be determined as appropriate depending on the material, thickness and the like of each layer.

After transparent electrode 18 is provided on p-type nitride semiconductor layer 17, p-type nitride semiconductor layer 17, MQW layer 16, V-pit expanding layer 15 and trigger layer 14 are etched so as to expose a portion of the upper surface of n-type nitride semiconductor layer 13. P side electrode 19A is provided on transparent electrode 18, and n-side electrode 19B is provided on the portion of n-type nitride semiconductor layer 13 which has been exposed by the etching. The nitride semiconductor light-emitting device according to this embodiment is thus obtained.

FIG. 7(a) is a schematic cross-sectional view of a nitride semiconductor light-emitting device according to a second embodiment of the present invention, and FIG. 7(b) is an enlarged cross-sectional view of a substantial part of the nitride semiconductor light-emitting device according to this embodiment. The nitride semiconductor light-emitting device according to this embodiment includes three trigger layers, and is otherwise substantially the same in structure as the nitride semiconductor light-emitting device according to the first embodiment above. The following mainly discusses the differences from the first embodiment.

As shown in FIG. 7(b), the nitride semiconductor light-emitting device according to this embodiment includes three trigger layers 24, with an interposed layer 25 being provided between adjacent trigger layers 24. By providing two or more trigger layers 24 in this manner, a larger number of V-pits 31 are generated than in the first embodiment, whereby the luminous efficiency becomes higher than in the first embodiment.

Trigger layers 24 may be made of the materials discussed in <Trigger Layer> in the first embodiment above. The thickness of each trigger layer 24 may be 20 nm or less, and is more preferably 10 nm or less, as was discussed in <Trigger Layer> in the first embodiment above. Although the number of trigger layers 24 cannot be generalized because it depends on the thickness, band gap energy, lattice constant or the like of the trigger layers, the number is preferably 1 or more and 50 or less, and more preferably 1 or more and 20 or less. If the number of trigger layers 24 is more than 51, the total thickness of trigger layers 24 increases too much, which may result in lowered luminous efficiency instead.

The material for interposed layers 25 is not limited. Interposed layers 25 may be an n-type GaN layer or an undoped GaN layer. The thickness of each interposed layer 25 is more preferably 1 nm or more and 100 nm or less. By providing interposed layers 25 in this manner, a larger number of V-pits 31 can be generated while the thickness of each trigger layer 24 is limited to 20 nm or less (namely, while the occurrence of crystal defects by trigger layers 24 themselves is prevented).

Examples

The following discusses the present invention in more detail with reference to examples, to which the present invention is not limited.

In Example 1, the nitride semiconductor device according to the first embodiment above was made and evaluated.

A GaN buffer layer was grown to a thickness of 25 nm by MOVPE on a c-plane sapphire substrate having a flat surface at a pressure of 100 kPa, at a temperature of 460° C., and at a V/III ratio of 40677. Then, an undoped GaN layer was grown to a thickness of 2.4 μm at a temperature of 1150° C. and a V/III ratio of 2536. $H_2$ was used as a carrier gas. Thereafter, a Si-doped n-type GaN layer was grown to a thickness of 2.5 μm. The n-type doping concentration was $4.41 \times 10^{18}$ $cm^{-3}$.

A trigger layer (2.5 nm thick) formed of a single Si-doped $In_xGa_{1-x}N$ layer (x=0.09) was grown at a lowered growth temperature of 820° C. and a V/III ratio of 6517. The n-type doping concentration in the trigger layer was $6 \times 10^{17}$ $cm^{-3}$. $N_2$ was used as a carrier gas.

A V-pit expanding layer (45 nm thick) made of Si-doped GaN was grown at the same growth temperature and a V/III ratio of 28630. The n-type doping concentration in the V-pit expanding layer was $6 \times 10^{17}$ $cm^{-3}$. $N_2$ was used as a carrier gas.

Six cycles of a well layer (3 nm thick) made of $In_xGa_{1-x}N$ (x=0.15) and a barrier layer (12.5 nm thick) made of GaN were grown at a growth temperature of 780° C. and a V/III ratio of 6517. $N_2$ was used as a carrier gas. An MQW layer was thus formed.

A Mg-doped p-$Al_xGa_{1-x}N$ layer (x=0.2, 20 nm thick) and a p-GaN layer (100 nm thick) were grown at a growth temperature of 1100° C. and a V/III ratio of 4405. $H_2$ was used as a carrier gas. A wafer was thus obtained. The obtained wafer was annealed for 30 seconds at 1000° C. in a nitrogen atmosphere.

After the annealing was completed, an ITO film was formed on the entire upper surface of the wafer. The ITO film, the p-GaN layer, the p-$Al_xGa_{1-x}N$ layer, the MQW layer, the V-pit expanding layer and the trigger layer were etched so as to expose the n-type GaN layer. A mesa portion (remaining portion which was not etched) was thus left. A p-side pad electrode was formed by successively stacking a Cr film and an Au film on the ITO film. An n-side electrode (pad electrode) was formed by successively stacking a Cr film and an Au film on the n-type GaN layer exposed by the etching. The electrode diameter was about 86 μm.

With a wafer prober (manufactured by Opto-System Co., Ltd., product number: WPSR3100) being applied to both the p-side electrode and the side electrode, a forward driving voltage $V_F$ (V) was measured by applying a forward current (having a current value of 20 mA), a reverse driving voltage $V_R$ (V) was measured by applying a reverse current (having a current value of −10 μA), a leak current $I_R$ (μA) was measured by applying a reverse voltage (having a voltage value of −5 V), and an emission intensity $V_L$ was measured by applying a forward current (having a current value of 20 mA). In addition, an emission spectrum was measured by applying a forward current (having a current value of 20 mA), to obtain an emission peak wavelength $\lambda_p$ (nm).

After the measurements with the prober were completed, the wafer was divided into pieces each having a size of 350× 350 μm. The piece was mounted on a TO-18 package for characteristics evaluation, and both the p-side electrode and the n-side electrode were wire bonded to the terminals of the TO-18 package. Then, an external quantum efficiency was measured using an integrating sphere measurement system (manufactured by Labsphere, Inc., product number: DAS-2100).

In Example 2, a nitride semiconductor light-emitting device was made in accordance with a method similar to that of Example 1 except that the trigger layer had a different structure.

Specifically, after a trigger layer (2.5 nm thick) formed of a single Si-doped $In_xGa_{1-x}N$ layer (x=0.09) was grown, an interposed layer made of Si-doped GaN was grown to a thickness of 2.5 nm at a growth temperature of 820° C. and a V/III ratio of 2536. The n-type doping concentration in the interposed layer was $6×10^{17}$ cm$^{-3}$. Then, the above-described trigger layer, the above-described interposed layer and the above-described trigger layer were successively grown. Thereafter, in accordance with the method described in Example 1, a V-pit expanding layer (35 nm thick), an MQW layer, a p-$Al_xGa_{1-x}N$ layer and a p-GaN layer were grown before an ITO film was formed. Then, prescribed etching was performed, and an n-side electrode and a p-side electrode were formed thereafter. The nitride semiconductor device thus obtained was evaluated in accordance with the method described in Example 1.

In Comparative Example 1, a nitride semiconductor light-emitting device was made in accordance with a method similar to that of Example 1 except that the trigger layer and the V-pit expanding layer were not provided. The nitride semiconductor device thus obtained was evaluated in accordance with the method described in Example 1.

In Comparative Example 2, a nitride semiconductor light-emitting device was made in accordance with a method similar to that of Example 1 except that an SLS layer was provided instead of the trigger layer and the V-pit expanding layer.

Specifically, as was discussed in <Relation Between Number of SLS Layers and LED Characteristics> above, a Si-doped n-type GaN layer was grown to a thickness of 2.5 μm, and then 10 cycles of a Si-doped $In_xGa_{1-x}N$ layer (x=0.09, 2.5 nm thick) and a GaN layer (2.5 nm thick) were stacked at a lowered growth temperature of 820° C. and a V/III ratio of 6517, to grow an SLS layer. The n-type doping concentration was $6×10^{17}$ cm$^{-3}$. $N_2$ was used as a carrier gas. Thereafter, in accordance with the method described in Example 1, an MQW layer, a p-$Al_xGa_{1-x}N$ layer and a p-GaN layer were grown before an ITO film was formed. Then, prescribed etching was performed, and an n-side electrode and a p-side electrode were formed thereafter. The nitride semiconductor device thus obtained was evaluated in accordance with the method described in Example 1.

The results are shown in Table 4.

The "SLS" column in Table 4 indicates the presence or absence of the SLS layer. In addition, "TL" in Table 4 indicates the trigger layer, and "EL" indicates the V-pit expanding layer.

In Examples 1 to 2, as shown in Table 4, forward driving voltage $V_F$ was decreased and the emission intensity was increased by a factor of five or more as compared to Comparative Example 1. It can therefore be said that a nitride semiconductor light-emitting device having a high luminous efficiency can be provided if a trigger layer and a V-pit expanding layer are formed.

In Examples 1 to 2, leak current $I_R$ during reverse bias was reduced almost by half as compared to Comparative Example 2. The reason for this may be because new threading dislocations occurred in the SLS layer which has the effect of increasing the V-pit but also includes many strains, whereas the strains were reduced and therefore the occurrence of threading dislocations TD was suppressed in the structure that combines the trigger layer and the V-pit expanding layer.

To compare Example 1 and Example 2, the emission intensity is higher in Example 2 than in Example 1. The reason for this may be because the larger number of trigger layers increased the number of generated V-pits in Example 2 than in Example 1.

Moreover, peak wavelength $\lambda_p$ did not vary greatly among Examples 1 to 2 and Comparative Examples 1 to 2. It can therefore be said that it is practical to provide a trigger layer and a V-pit expanding layer in order to provide a nitride semiconductor light-emitting device having a high luminous efficiency.

It should be understood that the embodiments and examples disclosed herein are illustrative and non-restrictive in every respect. The scope of the present invention is defined by the terms of the claims, rather than the description above, and is intended to include any variations within the scope and meaning equivalent to the terms of the claims.

REFERENCE SIGNS LIST

10 substrate; 11 buffer layer; 12 base layer; 13 n-type nitride semiconductor layer; 14 trigger layer; 15 V-pit expanding layer; 16 MQW layer (light-emitting layer); 16A well layer; 16B barrier layer; 17 p-type nitride semiconductor layer; 18 transparent electrode; 19A p-side electrode; 19B n-side electrode; 24 trigger layer; 25 interposed layer; 31 V-pit.

The invention claimed is:

1. A nitride semiconductor light-emitting device formed of an n-type nitride semiconductor layer, a trigger layer, a V-pit expanding layer, an MQW layer, and a p-type nitride semiconductor layer provided in this order,
said MQW layer having a V-pit formed therein,
said trigger layer being made of a nitride semiconductor material having a lattice constant different from that of a

TABLE 4

|  | SLS | Number of TLs | Thickness of EL (nm) | $V_F$ (V) (20 mA) | $V_R$ (V) (-10 μA) | $I_R$ (μA) (-5 V) | Emission intensity (20 mA) | $\lambda_p$ (nm) |
|---|---|---|---|---|---|---|---|---|
| Comparative Example 1 | NO | 0 | 0 | 4.76 | 10.00 | 0.05 | 60.1 | 469.5 |
| Comparative Example 2 | YES | 0 | 0 | 3.84 | 10.00 | 0.09 | 362.6 | 452.6 |
| Example 1 | NO | 1 | 45 | 3.73 | 10.00 | 0.05 | 330.2 | 451.8 |
| Example 2 | NO | 3 | 35 | 3.74 | 10.00 | 0.04 | 370.7 | 451.0 | material that forms an upper surface of said n-type nitride semiconductor layer, said V-pit expanding layer being made of a nitride semiconductor material having a lattice constant substantially identical to that of the material that forms the upper surface of said n-type nitride semiconductor layer, said V-pit expanding layer having a thickness of 5 nm or more and 5000 nm or less, and said MQW layer including a portion that is on an inclined facet of a V-pit of the V-pit expanding layer.

2. The nitride semiconductor light-emitting device according to claim 1, wherein said MQW layer is formed of a well layer and a barrier layer stacked on each other, and said trigger layer has a band gap energy larger than that of said well layer.

3. The nitride semiconductor light-emitting device according to claim 2, wherein the upper surface of said n-type nitride semiconductor layer is made of GaN, said well layer is made of $In_xGa_{1-x}N$ (0.01≤x<1), and said trigger layer is made of $In_yGa_{1-y}N$ (0.01≤y<x).

4. The nitride semiconductor light-emitting device according to claim 1, wherein the upper surface of said n-type nitride semiconductor layer and said V-pit expanding layer are made of GaN.

5. A method of manufacturing the nitride semiconductor light-emitting device according to claim 1, wherein a growth temperature of said trigger layer is equal to or lower than a growth temperature of said n-type nitride semiconductor layer, and a growth temperature of said V-pit expanding layer is equal to or higher than the growth temperature of said trigger layer.

6. The nitride semiconductor light-emitting device according to claim 3, wherein the upper surface of said n-type nitride semiconductor layer is made of GaN, said well layer is made of $In_xGa_{1-x}N$ (0.01≤x<1, and said trigger layer is made of $In_yGa_{1-y}N$ (0.01≤y<x).

7. The nitride semiconductor light-emitting device according to claim 1, wherein a plurality of said trigger layer are provided, and an interposed layer is provided between adjacent said trigger layers.

8. A nitride semiconductor light-emitting device formed of an n-type nitride semiconductor layer, a trigger layer, a V-pit expanding layer, an MQW layer, and a p-type nitride semiconductor layer provided in this order, said MQW layer having a V-pit formed therein, said trigger layer being made of a nitride semiconductor material having a lattice constant different from that of a material that forms an upper surface of said n-type nitride semiconductor layer, said V-pit expanding layer being made of a nitride semiconductor material having a lattice constant substantially identical to that of the material that forms the upper surface of said n-type nitride semiconductor layer, said V-pit expanding layer having a thickness such that said V-pit in an upper surface of said MQW layer has a diameter of 86 nm or more, and said MQW layer including a portion that is on an inclined facet of a V-pit of the V-pit expanding layer.

9. The nitride semiconductor light-emitting device according to claim 8, wherein said MQW layer is formed of a well layer and a barrier layer stacked on each other, and said trigger layer has a band gap energy larger than that of said well layer.

10. The nitride semiconductor light-emitting device according to claim 8, wherein the upper surface of said n-type nitride semiconductor layer and said V-pit expanding layer are made of GaN.

11. The nitride semiconductor light-emitting device according to claim 8, wherein a plurality of said trigger layer are provided, and an interposed layer is provided between adjacent said trigger layers.

12. A method of manufacturing the nitride semiconductor light-emitting device according to claim 8, wherein a growth temperature of said trigger layer is equal to or lower than a growth temperature of said n-type nitride semiconductor layer, and a growth temperature of said V-pit expanding layer is equal to or higher than the growth temperature of said trigger layer.

13. A nitride semiconductor light-emitting device formed of an n-type nitride semiconductor layer, a trigger layer, a V-pit expanding layer, a light-emitting layer, and a p-type nitride semiconductor layer provided in this order, said light-emitting layer having a V-pit formed therein, said trigger layer being made of a nitride semiconductor material having a lattice constant different from that of a material that forms an upper surface of said n-type nitride semiconductor layer, said V-pit expanding layer being made of a nitride semiconductor material having a lattice constant substantially identical to that of the material that forms the upper surface of said n-type nitride semiconductor layer, said V-pit expanding layer having a thickness of 5 nm or more and 5000 nm or less, and said trigger layer having a thickness of 20 nm or less.

14. A nitride semiconductor light-emitting device formed of an n-type nitride semiconductor layer, a trigger layer, a v-pit expanding layer, a light-emitting layer, and a p-type nitride semiconductor layer provided in this order, said light-emitting layer having a V-pit formed therein, said trigger layer being made of a nitride semiconductor material having a lattice constant different from that of a material that forms an upper surface of said n-type nitride semiconductor layer, said v-pit expanding layer being made of a nitride semiconductor material having a lattice constant substantially identical to that of the material that forms the upper surface of said n-type nitride semiconductor layer, said v-pit expanding layer having a thickness such that said v-pit in an upper surface of said light-emitting layer has a diameter of 86 nm or more, and said trigger layer having a thickness of 20 nm or less.

* * * * *